(12) United States Patent
Albrechta et al.

(10) Patent No.: US 6,547,974 B1
(45) Date of Patent: Apr. 15, 2003

(54) METHOD OF PRODUCING FINE-LINE CIRCUIT BOARDS USING CHEMICAL POLISHING

(75) Inventors: Stanley Michael Albrechta, Binghamton; Christina Marie Boyko, Conklin; Kathleen Lorraine Covert, Binghamton; Natalie Barbara Feilchenfeld; Voya Rista Markovich, both of Endwell; William Earl Wilson, Waverly; Michael Wozniak, Vestal, all of NY (US)

(73) Assignee: International Business Machines Corporation, Armonk, NY (US)

( * ) Notice: Subject to any disclaimer, the term of this patent is extended or adjusted under 35 U.S.C. 154(b) by 1161 days.

(21) Appl. No.: 08/495,277

(22) Filed: Jun. 27, 1995

(51) Int. Cl.⁷ ............................................. H01B 13/00
(52) U.S. Cl. .......................... 216/18; 216/38; 216/39; 216/49; 216/53; 216/85; 216/88; 216/90; 216/92; 216/100; 216/105
(58) Field of Search ............................... 216/18, 38, 39, 216/41, 49, 56, 88, 90, 100, 102, 105, 53, 85, 92; 437/228, 230

(56) References Cited

U.S. PATENT DOCUMENTS

| | | | |
|---|---|---|---|
| 4,604,799 A | 8/1986 | Gurol | 29/897 |
| 4,693,959 A * | 9/1987 | Ashcraft | 430/323 |
| 4,702,792 A * | 10/1987 | Chow et al. | 156/628 |
| 4,775,611 A | 10/1988 | Sullivan | 430/314 |
| 4,861,640 A | 8/1989 | Gurol | 428/137 |
| 4,954,142 A | 9/1990 | Carr et al. | 51/309 |
| 5,084,071 A | 1/1992 | Nenadic et al. | 51/309 |
| 5,118,385 A * | 6/1992 | Kumar et al. | 216/105 |
| 5,308,796 A | 5/1994 | Feldman et al. | 437/200 |
| 5,358,622 A * | 10/1994 | Korsten | 205/125 |
| 5,468,409 A * | 11/1995 | Dull | 216/105 |
| 5,494,781 A * | 2/1996 | Ohtani et al. | 430/313 |
| 5,502,893 A * | 4/1996 | Endoh et al. | 29/852 |

FOREIGN PATENT DOCUMENTS

| | | | |
|---|---|---|---|
| EP | 499314 A2 | * | 8/1992 |
| JP | 60-6462 | * | 1/1985 |
| JP | 63-318750 | * | 12/1988 |
| JP | 4-65832 | * | 3/1992 |
| JP | 5-109713 | * | 4/1993 |

* cited by examiner

Primary Examiner—Anita Alanko
(74) Attorney, Agent, or Firm—Terrance A. Meador

(57) ABSTRACT

A printed circuit board is produced by patterning a resist layer according to a circuit mask that defines desired circuit paths. The resist pattern layer is formed by removing the resist from the board in the desired circuit paths and a conductive material is plated onto the board in the resist voids defined by the circuit mask so that the height of the conductive material relative to the substrate equals or exceeds the height of the resist layer relative to the substrate. A low-reactive solution is applied over the conductive material and removes a surface portion of the conductive material. As the solution removes the conductive layer, it forms a film barrier and the solution composition changes, both of which substantially inhibits any further removal of the conductive material. Next, the film barrier is removed from the board allowing another film barrier to form stimulating the removal of further conductive material. The removal step is repeated until the conductive material is at a desired height relative to the height of the resist layer. The board is then finished using conventional circuit board fabrication techniques.

9 Claims, 5 Drawing Sheets

METHOD OF PRODUCING FINE-LINE CIRCUIT BOARDS USING CHEMICAL POLISHING

BACKGROUND OF THE INVENTION

1. Field of the Invention

This invention relates generally to producing circuit boards and, more particularly, to manufacturing fine-line printed circuit boards.

2. Description of the Related Art

Circuit boards provide a substantially planar surface on which electronic components can be mounted. Circuit paths for the components are provided by forming conductive lines on the circuit board that connect component-mounting through-holes in the board. Electrical leads that extend from the components are electrically connected to the conductive lines when the components are mounted to the board through-holes. Circuit boards can be single-sided, in which case components are mounted only on one surface of the circuit board, or circuit boards can be double-sided, in which case components can be mounted to both surfaces of the board. Generally, a single-sided board comprises a non-conductive substrate, such as a glass fiber-resin combination, with conductive lines formed on the board surface opposite the component mounting surface, and a double-sided board comprises a central conductive layer clad on top and bottom surfaces with non-conductive separation layers, with conductive lines formed on one or both board surfaces.

Printed circuit boards are generally manufactured using either a subtractive etch process, an acid plate pattern plating process, or an electroless pattern plating process. The electroless plating process is also referred to as additive pattern plating. In all of these processes, a circuit mask that lays out the desired pattern of the conductive lines is transferred to the circuit board by printing the circuit mask pattern onto a polymeric radiation-sensitive resist material deposited on the board. The resist material is irradiated in the pattern of the circuit mask so that it is physically transformed where it is irradiated and is unchanged where shielded by the circuit mask. The resist material thereafter can be developed by exposing it to a fast-reacting chemical solution that selectively removes either the irradiated material (called a positive-tone resist) or removes the non-irradiated material (negative-tone resist).

The subtractive etch process typically begins with a board substrate comprised of a non-conductive material on which a layer of conductive material such as copper is plated. A layer of resist material is then deposited and developed in the circuit mask pattern so as to expose the conductive material where circuit paths are not desired. The exposed conductive material in the resist voids is then etched away. Finally, the remaining resist material is removed, leaving behind conductive lines wherever circuit paths were desired. The subtractive etch process provides good control over circuit path height because the amount of conductive material plated onto the substrate generally can be controlled rather well. Precisely controlled circuit path height is especially important with surface mount techniques. Unfortunately, the subtractive etch process does not provide precise control over circuit path width, due to plating variation and lack of sharply defined path edges. The lack of width control is disadvantageous with current demands for increasingly high component mounting densities that require relatively thin conductive lines placed in close proximity to each other.

The acid plate pattern plating process uses electro-plating techniques to deposit conductive lines in circuit paths defined by resist material voids. That is, a conductive foil layer on the circuit board is connected to an electrode and the conductive material is deposited onto the board in the resist material voids using an oppositely charged electrode. The width of the conductive lines is generally dependant on the developed resist pattern, which typically is of photographic sharpness. Pattern plating thereby provides good control over circuit path width and permits conductive lines of relatively fine width. The circuit path height, however, can vary greatly depending on the density of the desired conductive lines. In particular, isolated conductive lines are thicker than densely packed conductive lines. Thus, line height is not precisely controlled by the acid plate process. The additive plate process is similar to the acid plate process, except that chemical plating techniques are used rather than electro-plating techniques. Additive plate fabrication generally requires more time to complete as compared to acid plate fabrication but is not as susceptible to circuit path height variation according to line density. Height variations for additive plate fabrication, however, experiences height variation from side to side differences as well as copper module formation.

Currently, the surfaces of pattern plated circuit boards are not planarized. Planarization methods such as surface machining would remove non-planar regions of the printed circuit board. Chemical mechanical polish, referred to as CMP, used in the semiconductor and ceramic industries, contains abrasive slurry materials which attack both resist and copper surfaces. Such polishing techniques are not compatible with many organic based substrates, which are often used in conjunction with surface-mount technology circuit boards. Surface-mount technology is gaining in popularity because it permits higher component densities and faster component mounting as compared with more conventional wire mount techniques.

The polishing techniques are generally incompatible with organic based substrates because such substrates are somewhat flexible and typically have surface undulations. The surface undulations are due to inherent variation in substrate thickness and also are due to the inherent flexibility of the boards, which permits bowing and warping. Conventional chemical-mechanical polishing techniques will not follow these undulations and contours of flexible substrates. As a result, board areas of extra thickness or that bow outward will be left with conductive lines having areas that are too thin, and board areas of reduced thickness or that dip into a valley will be left with conductive lines having areas that are too thick.

From the discussion above, it should be apparent that there is a need for a method of manufacturing fine-line printed circuit boards that efficiently produce circuit boards with fine lines that conform to board undulations. The present invention satisfies this need.

SUMMARY OF THE INVENTION

In accordance with the invention, a printed circuit board is produced from an initial substrate board coated with a resist layer. The resist layer is patterned according to a circuit mask that defines desired circuit paths. The patterned resist layer is then selectively removed from the board in the desired circuit paths and a conductive material is deposited on the board in the areas where resist was removed, as defined by the circuit mask. The conductive material is deposited so that the height of the conductive material relative to the substrate board equals or exceeds the height of the resist layer relative to the substrate board. In a first etching step, a low-reactive solution is applied over the conductive material and slowly dissolves it by first forming a film layer. Mechanical contact is then used to remove this film layer on any surface above the resist layer. The removal of the thin film layer allows a new conductive material surface layer to be exposed to the solution and a new film layer to be formed. This process continues until the height of the resist layer is reached. At this point, when contact with the conductive material cannot be made without contacting the resist layer, a final film layer is formed. This final film layer then becomes a barrier to the low reactive solution and, in fact, on any area that is below the resist layer such as a plated through hole. In this way, no abrasive materials used in ensuring that the height of the conductive line will be substantially uniform and will conform to substrate undulations and surface irregularities. Matching the conductive material height to the resist layer provides a convenient and reliable means of determining when the proper height has been reached. Conductive line width control is defined by the developed resist image. Circuit boards can thereby be produced that have uniform height and precise width, even with organic flexible composition substrates.

In one aspect of the invention, the relative height of the conductive material is determined by viewing a section of the board under an optical magnification device, such as a microscope, to determine when the relative height is the same. This is most easily accomplished by examining surface details of adjacent board areas. If surface details of adjacent areas are both in focus, then the adjacent areas are of equal height. If adjacent conductive material and resist material areas do not provide sufficient surface details for height comparison, then surface details can be provided by scratching or otherwise abrading the surface of adjacent board areas to provide small-sized debris. The debris provides surface details in the areas whose height is to be compared.

Other features and advantages of the present invention should be apparent from the following description of the preferred embodiment, which illustrates, by way of example, the principles of the invention.

DESCRIPTION OF THE PREFERRED EMBODIMENT

Figure 1:
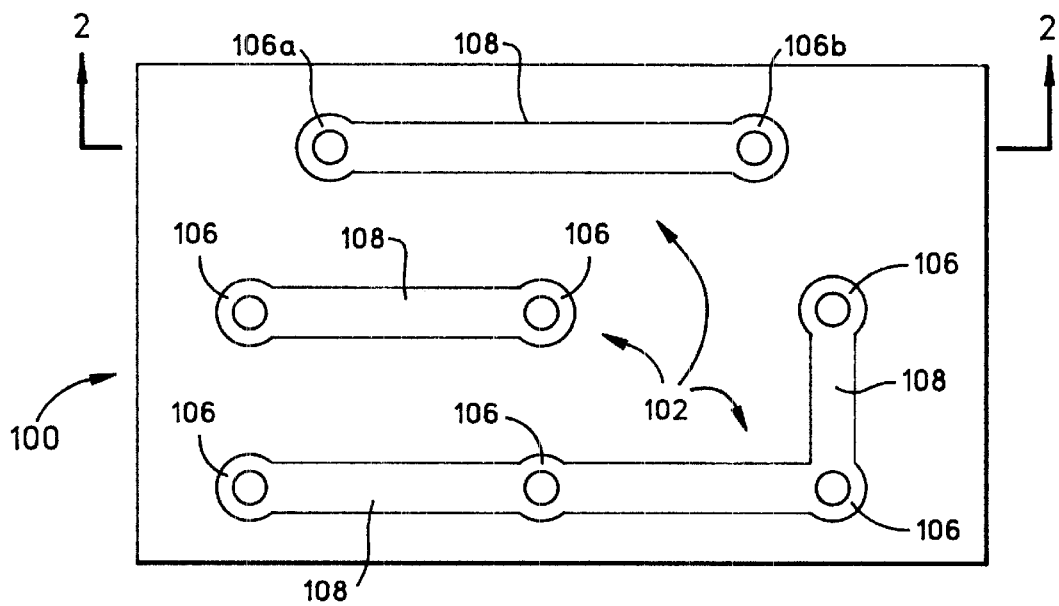
FIG. 1 is a plan view of a printed circuit board produced in accordance with the present invention.

FIG. 1 shows a printed circuit board 100 constructed in accordance with the present invention. A plurality of circuit paths generally indicated at 102 are distributed across a top surface 104 of the circuit board. The circuit paths comprise plated through-holes (PTH) 106 that extend through the board and are variously interconnected with relatively narrow, fine lines 108 of conductive material. As described further below, the height dimensions of the circuit paths 102 are improved when a low-reactive solution is applied to conductive material that is plated onto the circuit board. As the solution dissolves the conductive material, it becomes loaded such that the dissolving action of the solution is reduced. A film barrier is formed that inhibits further reaction of the loaded solution with the conductive material. By repeated removal of the film barrier the top-most surface of the conductive material is removed until it is of equal height with an adjacent resist layer. Because the resist layer height relative to the substrate can be readily controlled with great accuracy, and because the height of the conductive material relative to the resist layer can be readily determined and controlled, the height of the conductive material also can be controlled with great accuracy. Because no part of the height control steps requires abrasive polishing, the height of the conductive lines is uniform relative to the substrate.

Figure 2:
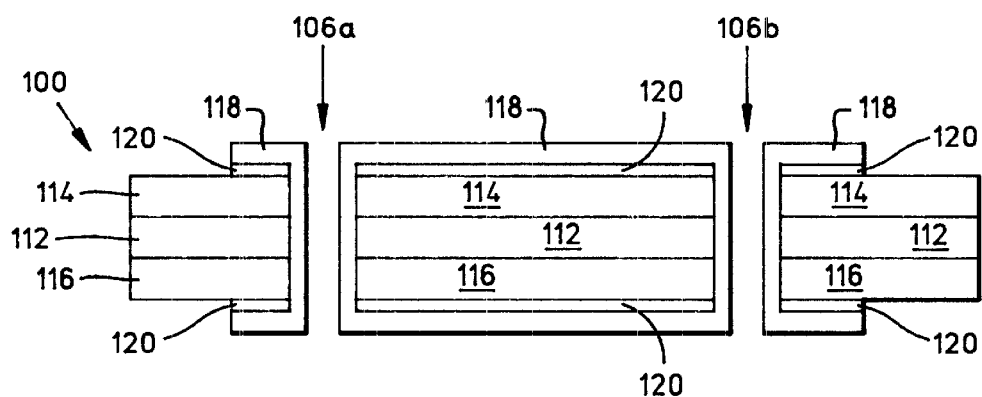
FIG. 2 is a cross-sectional view of the printed circuit board illustrated in FIG. 1 taken along the lines 2—2 in FIG. 1.

FIG. 2 shows a cross-sectional view of the completed circuit board illustrated in FIG. 1. The drawing shows that the board 100 comprises a center conductive layer 112, such as copper, that is clad with non-conductive separation layers 114, 116. The portions of the board 100 that are part of the circuit paths 102 (FIG. 1) are comprised of a conductive material, such as copper, that overlays a thin conductive layer 120, such as copper foil. The circuit board 100 is shown with plated through-holes, but it should be clear that the fabrication process in accordance with the present invention also can be applied to circuit boards to be used with surface mount technology that lacks through-holes. In FIG. 2, two of the through-holes 106a, 106b are designated for reference with the following drawings.

Figure 3:
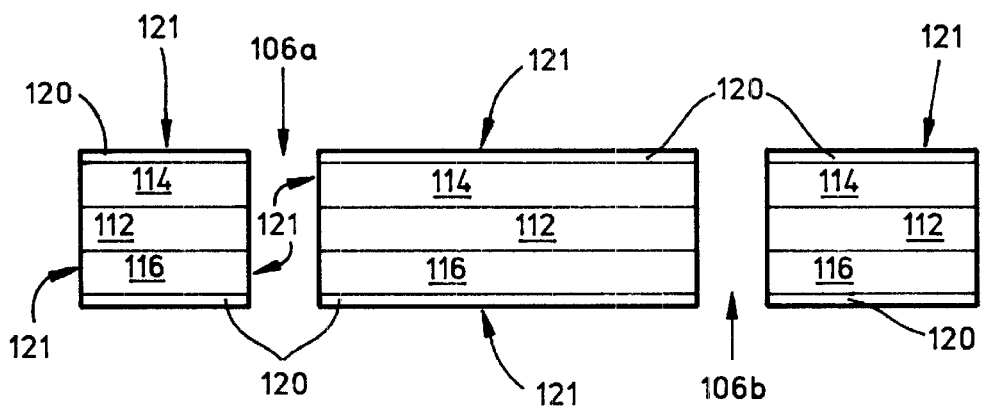
FIG. 3 is a cross-sectional view of the printed circuit board illustrated in FIG. 1 at an initial stage of the production, showing the copper substrate, separation planes, and conductive surfaces of the preferred embodiment.

The process of producing the printed circuit board 100 will now be described in greater detail. The process begins with the copper-clad substrate comprising the patterned copper layer 112 sandwiched between the separation layers 114, 116, as shown in FIG. 3. The thin conductive layer 120 is shown covering the top separation layer 114 and the bottom separation layer 116. In the case of an acid plate process, those skilled in the art will appreciate that another conductive layer 121 is applied over the entire board surface, covering all panel surfaces, including the top separation layer 114, the surface of the bottom separation layer 116, and the through-hole 106. Those skilled in the art will appreciate that an etch process does not require the outer conductive layer 121. For simplicity of illustration, the thin layer 121 is not shown in the drawing figures other than FIG. 3.

Figure 4:
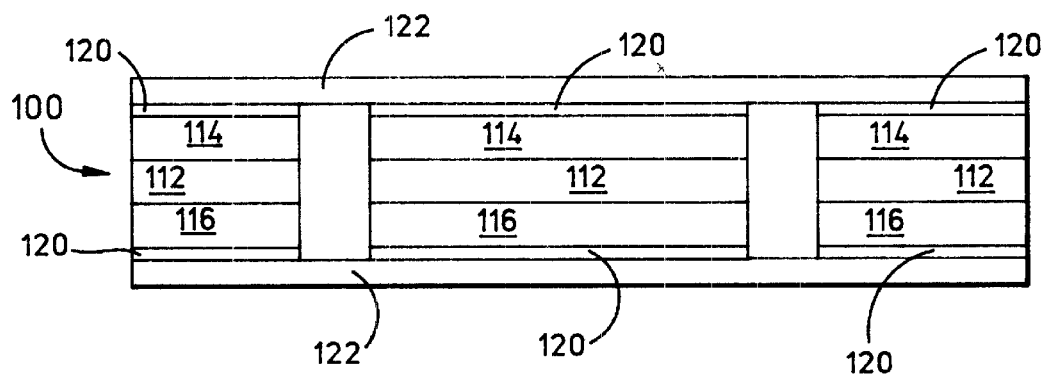
FIG. 4 is a cross-sectional view of the circuit board illustrated in FIG. 3 with a resist layer added.

FIG. 4 illustrates the next step of the process, which is to lay down a polymeric, radiation-sensitive resist layer 122 on the top and bottom surfaces of the board substrate. As illustrated in FIG. 4, the resist layer typically is laid across the through-holes 106. The resist layer can be deposited in sheet form and bonded to the board substrate or can be sprayed onto the board substrate and allowed to harden. In this way, it is possible to obtain planar resist layers 122 of relatively precise thickness, to within a tolerance of several tenths of mils, that are of substantially uniform thickness.

Figure 5:
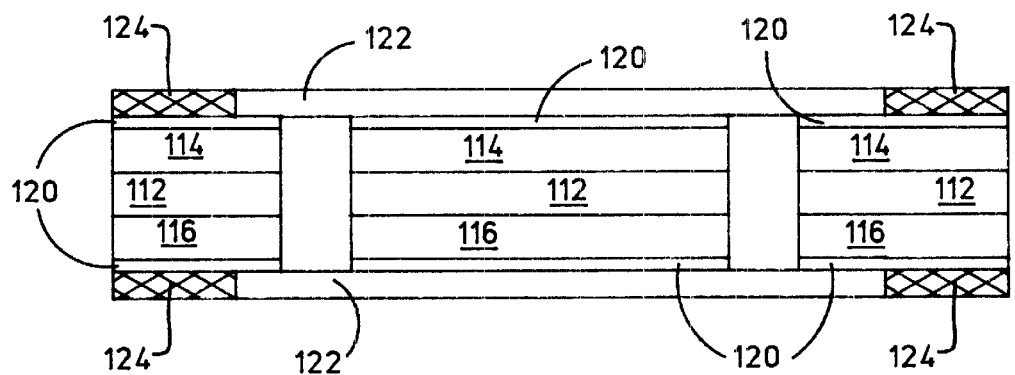
FIG. 5 is a cross-sectional view of the circuit board illustrated in FIG. 4 showing the transformation of the resist layer so as to define the desired circuit paths.
Figure 6:
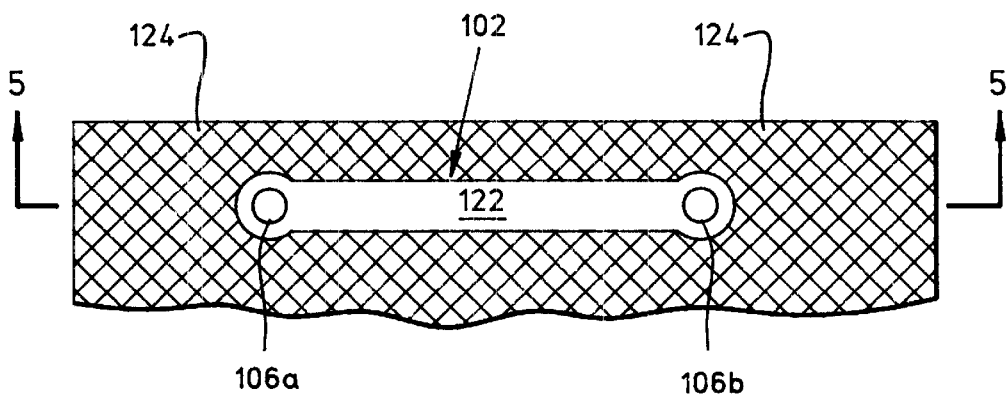
FIG. 6 is a plan view of the printed circuit board illustrated in FIG. 5 showing the transformed resist layer.

The next step, illustrated in FIG. 5, is to expose the resist layer 122 with a circuit mask and radiation source so as to define the desired circuit paths 102 (as shown in FIG. 1). Those skilled in the art will understand, without further explanation, how to select the resist material and the source of radiation to transform the exposed resist material such that it can be removed with an appropriate solution. In FIG. 5, the portions of the resist layer 122 that are transformed by irradiation are shown in selected portions 124 with cross-hatched lines. FIG. 6 is a plan view of the circuit board shown in cross-section in FIG. 5. Thus, in FIG. 6 the resist layer surface area 122 in the vicinity of the circuit path 102 that has been shielded by the circuit mask (not illustrated) has not been transformed, while the remaining areas of the resist layer 124 have been transformed (as indicated by the cross-hatched lines).

Figure 7:
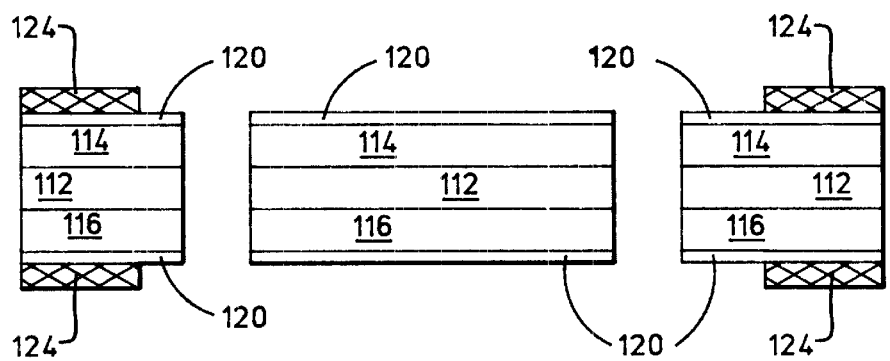
FIG. 7 is a cross-sectional view of the circuit board illustrated in FIG. 5 after removal of the resist layer where not needed.
Figure 8:
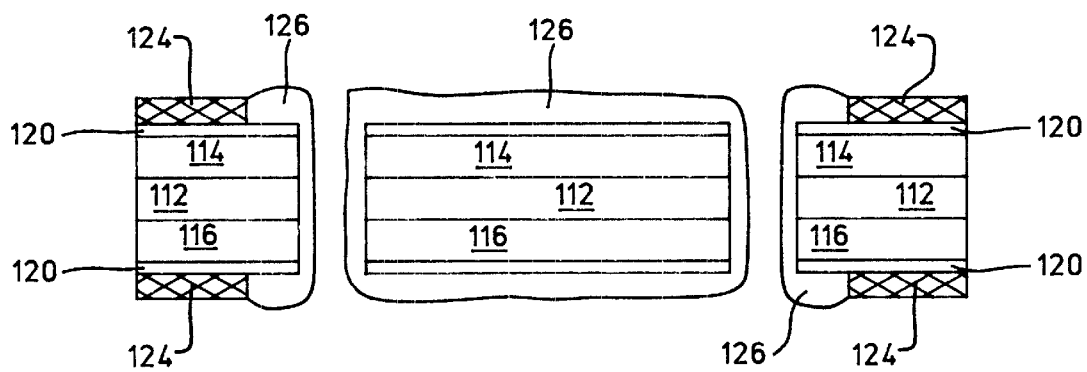
FIG. 8 is a cross-sectional view of the circuit board illustrated in FIG. 7 after plating with copper.

FIG. 7 shows that the next step in the process according to the present invention is to selectively remove the resist layer 122 from the areas in which conductive lines will be formed for the desired circuit paths. A variety of means for removing the resist layer will be known to those skilled in the art without further explanation. Such means typically include various chemical solutions. After the resist layer has been selectively removed, the next step as shown in FIG. 8 is to deposit a conductive material 126, such as copper, into the resist layer voids that were left from the resist developing step illustrated in FIG. 7. Typically, the conductive material 126 is deposited using conventional copper plating techniques. As shown in FIG. 8, the copper plating completely fills the resist layer voids.

It should be noted that in FIG. 8 the conductive material 126 is deposited onto the board 100 such that the thickness of the conductive material relative to the outer surface of the substrate top separation layer 114 and relative to the outer surface of the substrate bottom separation layer 116 is greater than the thickness of the transformed resist material 124. Thus, FIG. 8 shows that the deposited copper layer 126 extends outwardly above the substantially planar surfaces of the transformed resist material 124.

Figure 9:
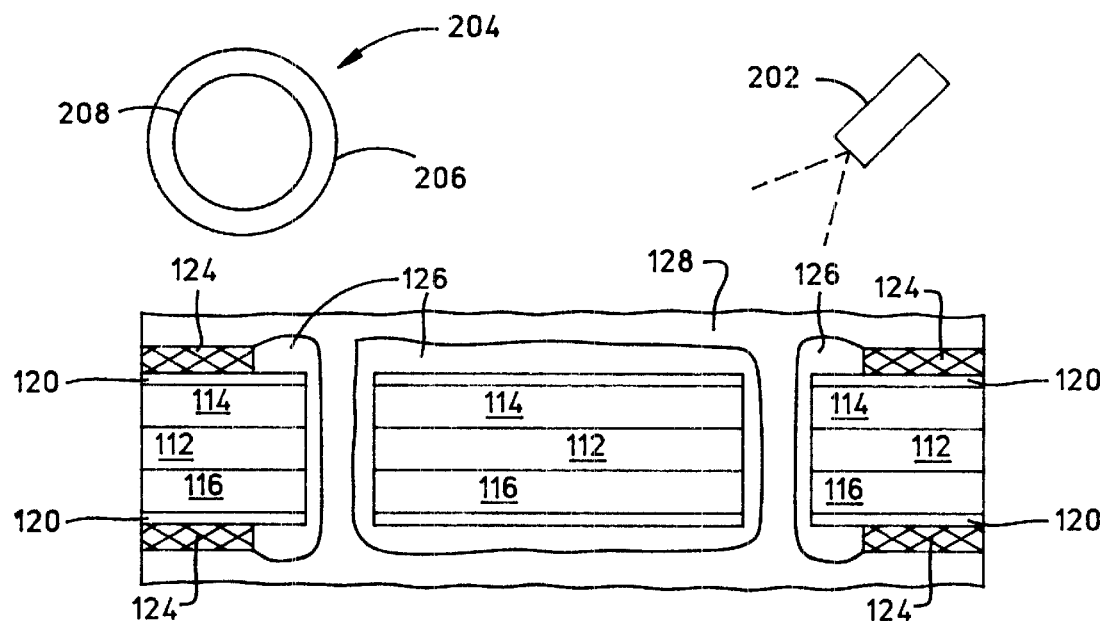
FIG. 9 is a cross-sectional view of the circuit board illustrated in FIG. 8 after application of the low-reactive solution.

The next step in the board fabrication process according to the present invention is to apply a low-reactive solution 128 to the copper plated board 100. The low-reactive solution, for example, can be a cupric chloride/hydrochloric acid solution. The cupric solution can be applied using a spray technique or can be soaked into an absorbent material and blotted onto the board. Both the top and bottom surfaces of the board can be done simultaneously, as illustrated in FIG. 9, or each side of the board can be done separately. FIG. 9 shows a spray nozzle 202 for applying the cupric solution and shows a film removal device 204 comprising an absorbent material 206 such as polyester cloth wrapped around a deformable rubber rolling wheel 208. The device 204 is rolled over the surface of the board substrate 100 such that the polyester cloth removes the film layer formed by the reactive solution.

The solution used in the preferred embodiment initially has a green color. As the reaction with the plated copper 126 and dissolves it, the solution becomes brown. The brown color is an indication that the solution is becoming loaded and its rate of dissolving the copper is reduced. Simultaneously, a film layer is formed that effectively becomes a barrier to the loaded solution. The film barrier is then removed on those surfaces that can be contacted with the device 204. The conductive areas where the film barrier is removed are now exposed to the loaded etchant solution. A new film layer will begin to form on the exposed areas, even in the loaded etchant. Basically, those areas which can be contacted by the device 204 have an increased copper removal rate as compared with those areas which cannot be contacted. Areas that cannot be contacted are plated through holes and conductor lines below the height of the resist. The dissolving action of the cupric solution can be restored by adding fresh solution.

Figure 10:
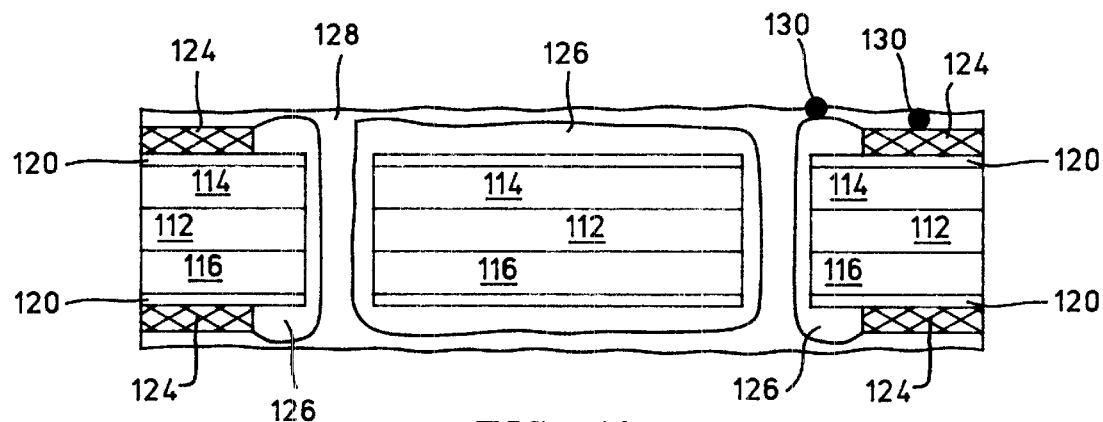
FIG. 10 is a cross-sectional view of the circuit board illustrated in FIG. 9 after a portion of the loaded low-reactive solution has been removed to stimulate further removal of the copper layer.

The loading of the solution and the leveling of the conductive material circuitry happen simultaneously. FIG. 10, the cross-sectional diagram, illustrates the removal of copper from the top and bottom surfaces of the conductive material while removal of copper from the plated through hole is inhibited. It should be noted that the surface film is not removed from the interior of the through-holes 106*a*, 106*b*. Thus, the action of the etchant solution in the through-holes will substantially stop. This outcome is advantageous because it permits the thickness of the plated through-holes not to be altered substantially.

After the loaded cupric solution is removed from the top and bottom board surfaces, the height of the copper portions 126 can be compared to the height of the transformed resist layer portions 124 of the board. Preferably, this comparison is accomplished with an optical magnification instrument, such as a microscope. A portion of the circuit board can be placed under a comparison microscope and, using an optical comparator device known to those skilled in the art, the height of the copper relative to the height of the resist layer can be determined. If there is insufficient surface detail to easily determine the relative height, then the surface of the copper layer 126 and transformed resist layer 124 can be scratched with an abrasive material so that surface debris is deposited in adjacent areas of the copper and the resist layer. Such surface debris is illustrated in FIG. 10 as spherical objects 130. The debris provides objects of surface detail on which the optical magnification instrument can be focused, thereby more easily determining the relative height of the conductive material and the resist layer.

Figure 11:
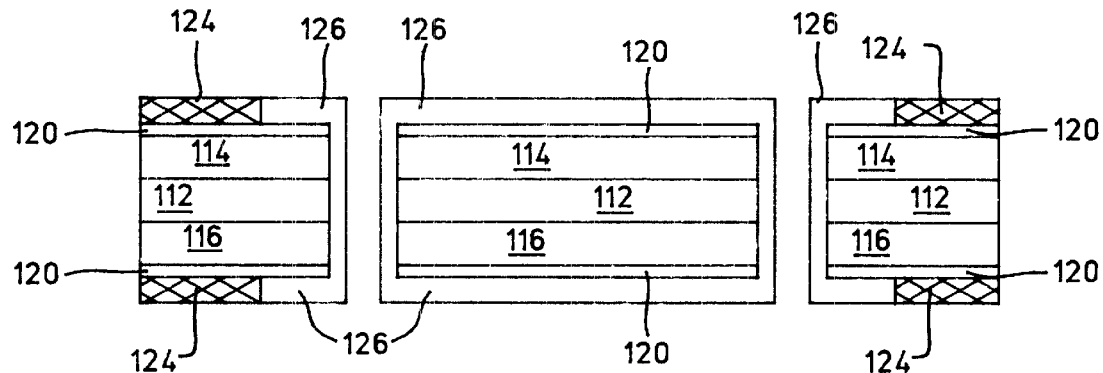
FIG. 11 is a cross-sectional view of the circuit board illustrated in FIG. 9 after removal of copper has been completed and the low-reactive solution has been removed.

FIG. 11 shows the circuit board after the cupric solution 128 has been applied and the barrier solution removed repeatedly until an optical magnification has verified that the height of the copper layer 126 is substantially the same as the height of the transformed resist layer 124. Using the optical comparison technique, it has been found possible to selectively remove the copper material with the cupric solution to a desired height tolerance of within 0.1 mils of the height of resist. Such height accuracy has been achieved using semi-conductor techniques. These techniques, for example, might attempt to planarize the copper material (such as illustrated in FIG. 8) using chemical and/or mechanical polishing. As noted above, such polishing techniques are effective with relatively stiff substrates and do not follow surface contours. Thus, such techniques are not applicable to organic based substrates.

Figure 12:
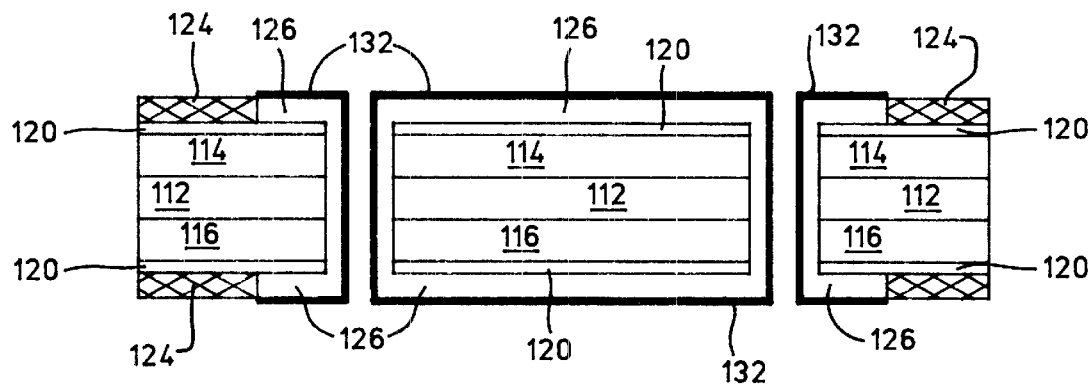
FIG. 12 is a cross-sectional view of the circuit board illustrated in FIG. 11 after a conductive protective layer has been added to the copper surface.
Figure 13:
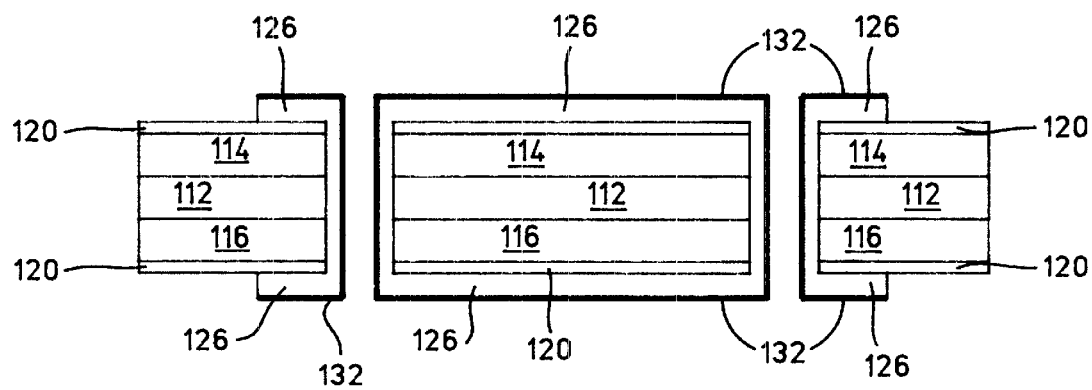
FIG. 13 is a cross-sectional view of the circuit board illustrated in FIG. 12 after the resist layer has been removed.
Figure 14:
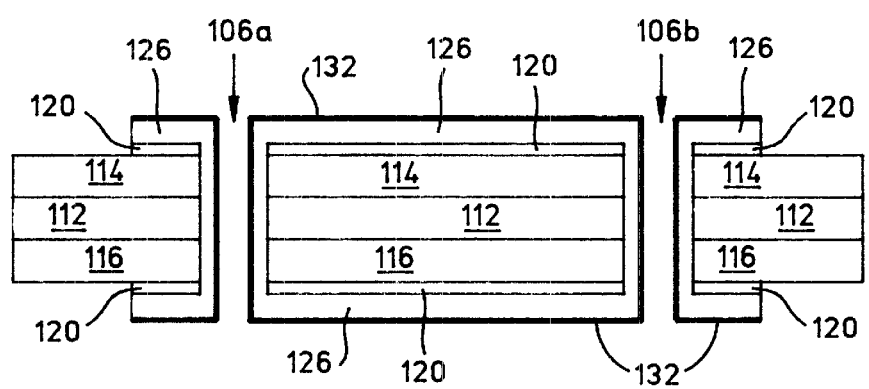
FIG. 14 is a cross-sectional view of the circuit board illustrated in FIG. 13 after the conductive copper layer has been removed.

After the relative height of the copper material 126 and the resist layer 124 are at their desired levels, conventional processing steps can be used to finish the circuit board. Thus, in FIG. 12, a protective layer 132 has been deposited over the conductive material portions of the board. In FIG. 13, the remaining transformed resist layer has been removed from the board. Those skilled in the art will understand the details of how the removal is accomplished without further explanation. In FIG. 14, the conductor surface comprising a copper foil 120 has been removed from the board, preferably with an etchant solution. The final step in conventional processing is to remove the protective layer 132, which results in the finished product 100 as illustrated in FIG. 2.

The printed circuit board described above is efficiently produced using the described chemical polishing technique so that circuit paths having fine lines are formed and have substantially uniform thickness that conforms to board substrate undulations. Such printed circuit boards are especially suited to high-density component placement, as often is required for surface-mount technology.

The present invention has been described above in terms of a presently preferred embodiment so that an understanding of the present invention can be conveyed. There are, however, many configurations for producing fine-line organic substrates not specifically described herein but with which the present invention is applicable. The present invention should therefore not be seen as limited to the particular embodiment described herein, but rather, it should be understood that the present invention has wide applicability with respect to printed circuit boards technology. All modifications, variations, or equivalent arrangements that are within the scope of the attached claims should therefore be considered to be within the scope of the invention.

We claim:

1. A method of producing a circuit board, comprising the steps of:
   (a) patterning a resist layer that overlays a substrate of the circuit board to define desired circuit paths;
   (b) removing the patterned resist layer in the desired circuit paths;
   (c) depositing a conductive material on the circuit board in the pattern defined by the removed resist layer so that the height of the conductive material relative to the substrate exceeds the height of the resist layer relative to the substrate;
   (d) applying a low-reactive solution, over at least the conductive material, that initially removes a surface portion of the conductive material and forms a film barrier that inhibits any further removal of the conductive material;
   (e) disrupting the film barrier to thereby stimulate removal of additional surface portion and formation of additional film barrier; and
   (f) repeating step (e) until the conductive material is at a desired uniform height relative to the height of the resist layer above the substrate.

2. A method as defined in claim 1, wherein the desired height of the conductive material with respect to the substrate is the same as the height of the resist layer with respect to the substrate.

3. A method as defined in claim 1, wherein the step (f) comprises optically examining surface details of adjacent portions of the conductive material and the resist layer to determine if the adjacent portions are of the same relative height.

4. A method as defined in claim 3, wherein the step (f) further comprises defacing adjacent portions of the conductive material and the resist layer to create debris that defines easily viewed surface details of the respective adjacent portions.

5. A method as defined in claim 1, wherein the step (e) comprises removing the film barrier from the circuit board.

6. A method as defined in claim 5, further comprising the step of adding additional low-reactive solution.

7. A method as defined in claim 1, wherein the step (d) comprises spraying the low-reactive solution over the circuit board.

8. A method as defined in claim 1, wherein the step (d) comprises pressing an absorbent material soaked with the low-reactive solution against the circuit board.

9. A method of forming conductive circuit paths across a substrate material, comprising the steps of:
   (a) patterning a resist layer that overlays the substrate material to transform portions of the resist layer and thereby define desired circuit paths;
   (b) removing the transformed resist layer portions according to the desired circuit paths;
   (c) depositing a sufficient amount of conductive material in the removed resist layer portions so that the height of the conductive material relative to the substrate exceeds the height of the resist layer relative to the substrate;
   (d) applying a low-reactive acid solution that initially removes a surface portion of the conductive material and rapidly forms a film barrier that inhibits any further removal;
   (e) removing the film barrier and thereby stimulating removal of additional surface portions and formation of additional film barrier; and
   (f) repeating step (e) until the conductive material is at a desired uniform height relative to the resist layer above the substrate.

\* \* \* \* \*